United States Patent
Reuter

(10) Patent No.: US 10,008,657 B2
(45) Date of Patent: Jun. 26, 2018

(54) PIEZOELECTRIC ADJUSTMENT APPARATUS

(71) Applicant: Marco Systemanalyse und Entwicklung GmbH, Dachau (DE)

(72) Inventor: Martin Reuter, Dachau (DE)

(73) Assignee: MARCO SYSTEMANALYSE UND ENTWICKLUNG GMBH, Dachau (DE)

( * ) Notice: Subject to any disclaimer, the term of this patent is extended or adjusted under 35 U.S.C. 154(b) by 674 days.

(21) Appl. No.: 14/611,802

(22) Filed: Feb. 2, 2015

(65) Prior Publication Data

US 2015/0221853 A1    Aug. 6, 2015

(30) Foreign Application Priority Data

Feb. 6, 2014   (DE) .................. 10 2014 101 512

(51) Int. Cl.
  *H01L 41/09*   (2006.01)
  *H01L 41/083*  (2006.01)
  *H01L 41/053*  (2006.01)
  *F16K 31/00*   (2006.01)
  *H01L 41/04*   (2006.01)
  *H02N 2/04*    (2006.01)

(52) U.S. Cl.
  CPC .......... *H01L 41/053* (2013.01); *F16K 31/007* (2013.01); *H01L 41/04* (2013.01); *H01L 41/09* (2013.01); *H02N 2/043* (2013.01); *H01L 41/083* (2013.01)

(58) Field of Classification Search
  CPC ....... H01L 41/053; H01L 41/04; H01L 41/09; F16K 31/007; H02N 2/043

USPC ......... 310/323.01, 323, 12, 17, 323.19, 328, 310/346

See application file for complete search history.

(56) References Cited

U.S. PATENT DOCUMENTS

| 3,614,486 | A  | 10/1971 | Smiley |
| 5,092,360 | A  | 3/1992  | Watanabe et al. |
| 5,328,149 | A  | 7/1994  | Reuter |
| 5,900,691 | A  | 5/1999  | Reuter et al. |
| 6,191,522 | B1 | 2/2001  | Reuter |
| 6,427,897 | B2 | 8/2002  | Wallaschek et al. |
| 6,794,800 | B1 | 9/2004  | Heinz |

(Continued)

FOREIGN PATENT DOCUMENTS

| CN | 01884972 A | 11/2010 |
| DE | 4220177 A1 | 12/1993 |

(Continued)

OTHER PUBLICATIONS

Official Communication from Korean Patent Office; 5 pages.
Communication received from the Patent Office in China; dated Jul. 5, 2016; 8 pages.

*Primary Examiner* — Thomas Dougherty
(74) *Attorney, Agent, or Firm* — Cantor Colburn LLP

(57) ABSTRACT

A piezoelectric adjustment apparatus comprises a piezoelectric stack which has a plurality of layers of piezoelectric material arranged in a stacked manner and each provided with electrodes, and comprises a lever mechanically connected to the piezoelectric stack for converting a drive movement of the stack into an adjustment movement of an adjustment element provided at the lever. A cooling device for dissipating heat from the piezoelectric stack is provided.

9 Claims, 4 Drawing Sheets

(56) References Cited

U.S. PATENT DOCUMENTS

| | | | |
|---|---|---|---|
| 6,998,762 B2 | 2/2006 | Lubitz et al. | |
| 2001/0047828 A1* | 12/2001 | Berger | F15B 13/0438 |
| | | | 137/596.17 |
| 2008/0264496 A1* | 10/2008 | Reuter | F16K 31/006 |
| | | | 137/528 |
| 2010/0284026 A1* | 11/2010 | Reuter | B05B 1/3046 |
| | | | 356/614 |
| 2014/0077660 A1* | 3/2014 | Knight | H02N 2/043 |
| | | | 310/328 |

FOREIGN PATENT DOCUMENTS

| | | | | |
|---|---|---|---|---|
| DE | 4445642 A1 | 6/1996 | | |
| DE | 19909451 A1 * | 9/2000 | | F02M 51/06 |
| DE | 19912334 A1 | 9/2000 | | |
| DE | 10042941 A1 | 3/2002 | | |
| DE | 10141820 A1 | 3/2003 | | |
| DE | 102005003453 A1 * | 8/2006 | | F02M 51/06 |
| DE | 102006026932 A1 | 12/2007 | | |
| DE | 102009014494 A1 | 10/2010 | | |
| DE | 102009020785 A1 | 11/2010 | | |
| DE | 102010015171 A1 | 10/2011 | | |
| DE | 102011051370 A1 | 12/2012 | | |
| EP | 0693788 A1 | 1/1996 | | |
| EP | 0947002 B1 | 2/2004 | | |
| EP | 1142039 B1 | 3/2004 | | |
| JP | H03234981 A | 10/1991 | | |
| JP | H07131085 A | 5/1995 | | |
| JP | 080974749 A | 4/1996 | | |
| JP | 2010261594 A | 11/2010 | | |
| WO | 0063980 A1 | 10/2000 | | |
| WO | WO-2006/100247 A1 * | 9/2006 | | H04L 41/083 |

* cited by examiner

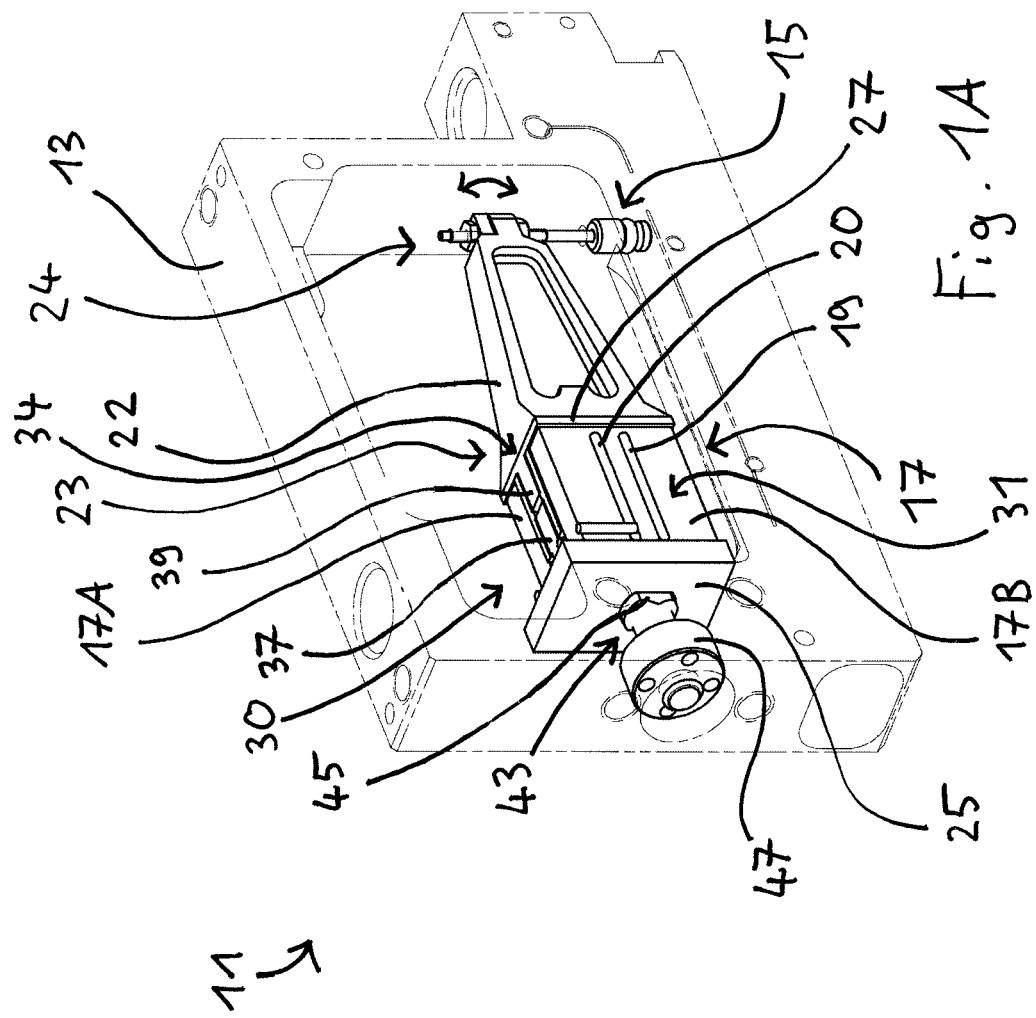

PIEZOELECTRIC ADJUSTMENT APPARATUS

The present invention relates to a piezoelectric adjustment apparatus, in particular to a piezoelectric metering valve, having a piezoelectric stack which comprises a plurality of layers of piezoelectric material arranged in stacked form and each provided with electrodes and having a lever mechanically connected to the piezoelectric stack for converting a drive movement of the stack into an adjustment movement of an adjustment element, in particular a valve plunger, provided at the lever.

Piezoelectric adjustment apparatus are characterized by a high adjustment precision and a fast switching behavior. In such apparatus, the piezoelectric stack can be clamped between a base and a counter base to provide a corresponding preload. The lever can either be fastened to the counter base as a separate component or can be configured in one piece therewith.

There is an endeavor to achieve a switching frequency which is as high as possible, in particular with metering valves in the field of process technology. A limiting factor in this respect is the thermal energy which inevitably arises during operation within the piezoelectric stack and which typically amounts to approximately 10% to 20% of the supplied energy and can result in an unwanted overheating of the stack. Since piezoelectric ceramic components have a comparatively small thermal conductivity, there is the problem of an impending overheating, in particular with piezoelectric stacks having a high power and a correspondingly large volume.

It is an object of the invention to expand the field of use of piezoelectric adjustment apparatus of the above-named kind and in particular to allow high switching frequencies.

The object is satisfied by a piezoelectric adjustment apparatus having the features of claim 1.

In accordance with the invention, a piezoelectric adjustment apparatus comprises a cooling device for dissipating heat from the piezoelectric stack. Depending on the application, such a cooling device can act passively, that is by transferring the heat to the environmental air, or actively using a cooling fluid to be transported. A combination of active and passive cooling is also possible. A piezoelectric stack can be controlled at a higher frequency with a given volume due to the existing cooling device since the risk of heat accumulation in its interior is reduced.

The cooling device can comprise a layer of thermally conductive material via which layer at least one outer surface, in particular a side surface, of the piezoelectric stack is in contact with a wall section of a housing of the adjustment apparatus. Thermal energy can be dissipated from the stack surface in an efficient manner via such a layer having increased thermal conductivity, which ultimately also contributes to a lowering of temperature in the interior of the stack. The layer of thermally conductive material preferably extends over the full area of the respective outer surface. A connection of two oppositely disposed side surfaces of the piezoelectric stack to the housing wall via corresponding separate layers of thermally conductive material can in particular be advantageous with a narrow housing shape desired for many metering valves.

An embodiment of the invention provides that the piezoelectric stack is divided into at least two, preferably into exactly two, part stacks arranged next to one another and provided with respective associated electrodes. An enlargement of the stack surface, which promotes a heat dissipation from the stack, is hereby achieved with a substantially unchanged power. If the application requires, a division into more than two part stack can also be provided.

The piezoelectric stack can in particular be divided, preferably into part stacks of identical size, along a dividing plane extending in parallel with the stack direction. In other words, the thickness of the stack is preferably divided. The maximum deflection of the stack is not impaired by such a division.

The part stacks are preferably separated from one another by an intermediate space. An unwanted heat transfer between the part stacks is hereby countered.

Provision can furthermore be made that the cooling device is at least partly arranged in the intermediate space and/or that fluid such as air present in the intermediate space forms a part of the cooling device. This not only allows an effective thermal dissipation from the region between the part stacks, but rather also a particularly space-saving construction.

In accordance with a special embodiment of the invention, the cooling device comprises a heat sink of a thermally conductive material, preferably of metal, arranged at least partly in the intermediate space. This allows a particularly simple and inexpensive cooling of the stack.

A base cooling rib extending from a base and projecting into the intermediate space and/or a lever cooling rib extending from the lever and projecting into the intermediate space can be provided as the heat sink(s). Such cooling ribs can e.g. be molded directly at the base or at the lever so that a provision of separate heat sinks is not required. The base and the lever can therefore be utilized for a thermal dissipation in addition to their mechanical function.

The cooling device can furthermore comprise a thermally conductive material with which free spaces are filled which are present in the intermediate space between the surfaces of the part stacks and, optionally, in components present in the intermediate space. The thermal dissipation from the stack can thereby be further improved.

A further embodiment of the invention provides that the piezoelectric stack is clamped between a base common to all part stacks and a counter base common to all part stacks by means of a clamping element, with the clamping element extending through the intermediate space in parallel with the stack direction. Only a single clamping element is thus required. With an undivided stack, in contrast, at least two clamping elements positioned laterally next to the stack generally have to be provided to avoid too large an uneven clamping force. The utilization of the intermediate space for leading the clamping element through the total stack thus contributes to a reduction of the manufacturing costs and of the required construction space.

The clamping element can comprise a shaft section with a flattened cross-section provided for arrangement in the intermediate space. The width of the clamping element in the region between the part stacks can be reduced by the flattened cross-section. The part stacks can thus be arranged relatively close to one another. The clamping element can specifically be a clamping screw which has a thread section at the end side for screwing on a clamping nut. Since in this case the clamping takes place by means of the clamping nut, the clamping screw itself does not have to have a continuously round cross-section.

The invention also relates to an adjustment apparatus having a piezoelectric stack which comprises a plurality of layers of piezoelectric material arranged in a stacked manner and each provided with electrodes, having a base mechanically connected to a first end face of the stack and having a lever mechanically connected to a second end face of the stack for converting a drive movement of the stack into an adjustment movement of an adjustment element, in particular of a valve plunger, provided at the lever.

In accordance with the invention, at least one section of a force-transmission arrangement which comprises the base, the piezoelectric stack and the lever is configured as spring-elastic to effect an overshoot of the adjustment apparatus with respect to the drive movement. It is possible to increase the adjustment stroke with a predefined stack deflection by utilizing the overshoot effect. Whereas the components of the force-transmission arrangement are typically designed to be as stiff as possible in the technical field, it has been recognized in accordance with the invention that an overshoot of the lever and of the adjustment element provided thereat can be brought about by the direct provision of one or more spring-elastic regions, which is accompanied by a stroke increase. Such a stroke increase is in particular of advantage because less energy thereby has to be supplied to the piezoelectric stack with a predefined stroke and a predefined frequency so that accordingly less thermal energy is also generated in the stack.

The lever can have an articulated point which allows a resilient pivoting of a first lever part with respect to a second lever part or of the lever per se with respect to an adjacent component. This allows a particularly simple construction. The articulated point is preferably arranged in a surrounding region of the stack, that is at the end of the stack near the end of the lever, to utilize the lever effect in the overshoot.

The articulated point can be formed by a flexible section of the lever. No separate articulated components then have to be provided.

The lever can specifically have a reduced cross-sectional size and/or a changed cross-sectional shape in the region of the articulated point. Such a "thin point" is particularly favorable from a technical manufacturing aspect.

It is furthermore preferred that the resonant frequency of the oscillatory force-transmission arrangement is adapted to a predefined nominal frequency of the adjustment element. The resonant frequency is determined by the mass of the respective components, that is of the base, of the stack, of the lever and/or of the adjustment element, as well as by the spring constant of the elastic regions. The oscillatory system can thus be configured by a suitable dimensioning of these parameters such that the normal operation of the adjustment apparatus substantially takes place at the resonant frequency. The stroke of the adjustment element then does not follow the deflection of the stack, as with existing adjustment apparatus, but is rather considerably increased with respect thereto—independently of the direct mechanical lever effect. In addition, the temporal progression of the stroke with respect to the temporal progression of the stack deflection is phase shifted by 90°. An adjustment apparatus in accordance with the invention can therefore be configured such that it is predominantly operated in resonance, whereby a particularly pronounced stroke increase and a corresponding heat reduction result.

To ensure such a resonant operation, an adjustment apparatus in accordance with the invention can comprise an electronic control device which is configured to operate the piezoelectric stack substantially at the resonant frequency of the oscillatory force-transmission arrangement.

A further embodiment of the invention provides that the stack is configured for a tilting drive movement which is converted by the lever into a linear adjustment movement of the adjustment element. Such arrangements are in particular characterized by a small space requirement.

The stack can furthermore have a piezoelectrically passive region in which no electrical field arises. The electrical contacts can be arranged in the piezoelectrically passive region to reduce their mechanical load.

Further developments of the invention are set forth in the dependent claims, in the description and in the enclosed drawings.

The invention will be described in the following purely by way of example with reference to the enclosed drawings.

FIGS. 1A to 1C show a first embodiment of a piezoelectric adjustment apparatus in accordance with the invention in a perspective view, a side view and a plan view;

Figure 1B:
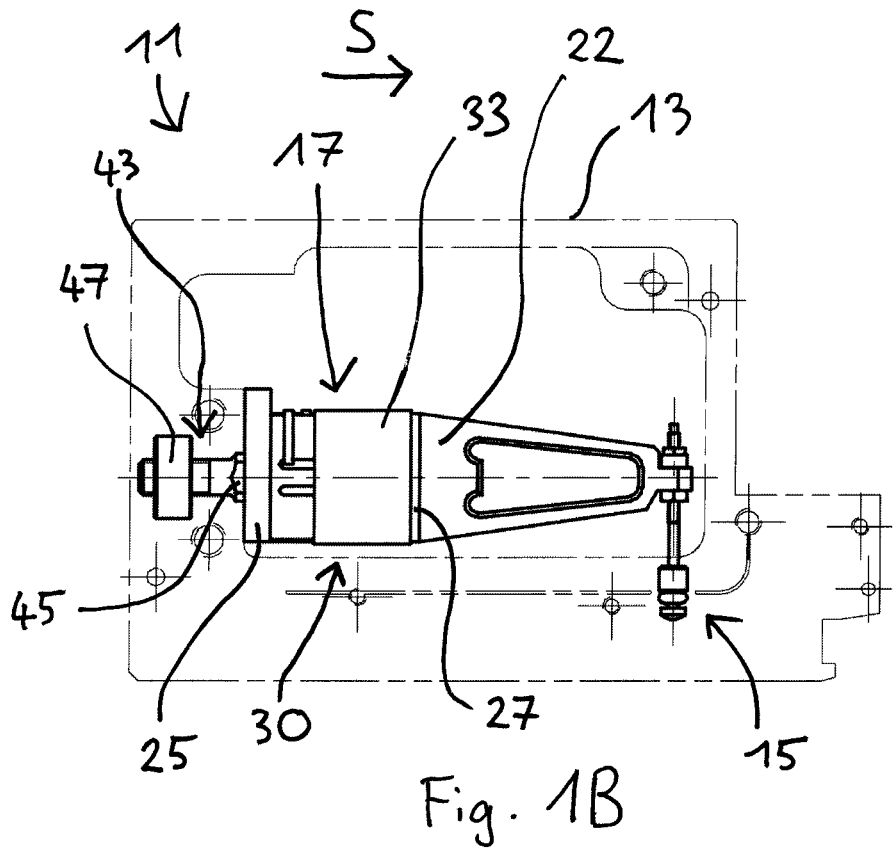
Figure 1C:
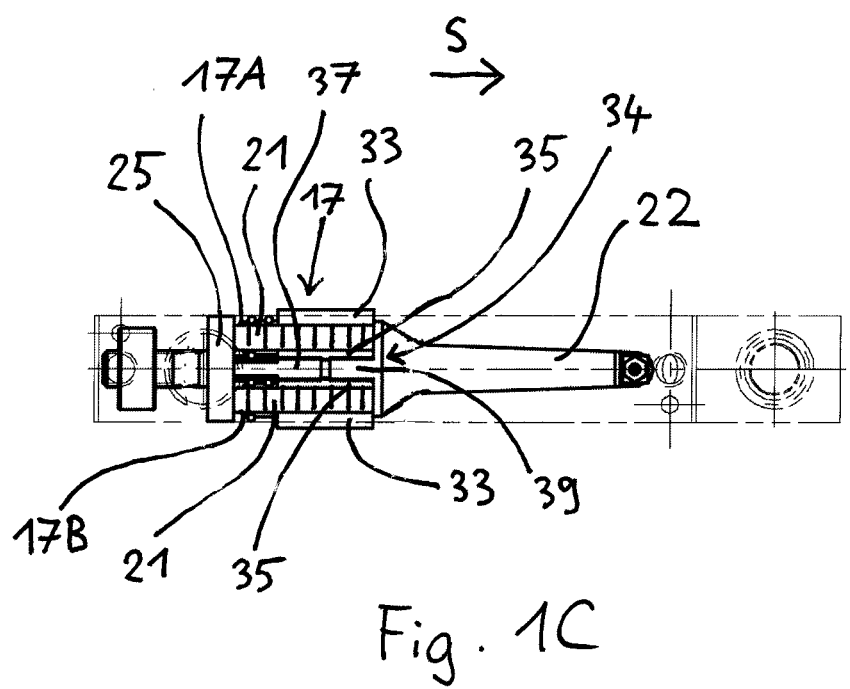

The piezoelectric adjustment apparatus 11 shown in FIGS. 1A to 1C is configured as a metering valve and comprises a housing 13, only shown in part, a linearly displaceable adjustment element 15 in the form of a valve plunger, and a piezoelectric stack 17 for driving the adjustment element 15. The piezoelectric stack 17 is compiled in a generally known manner from a plurality of layers 21 (FIG. 1C) of piezoelectric material arranged in a stacked manner and each provided with electrodes 19, 20. The piezoelectric stack 17 is furthermore configured for a tilting drive movement, as is indicated by the double arrow in FIG. 1A. The piezoelectric stack 17 specifically works in accordance with the so-called double-stack principle and comprises, in addition to two piezoelectrically active regions, a piezoelectrically passive region, as is disclosed in EP 0 947 002 B1.

To convert the tilting drive movement of the piezoelectric stack 17 into a linear adjustment movement of the adjustment element 15, a lever 22 is provided which is mechanically connected to the piezoelectric stack 17 at one lever end 23 and which supports the adjustment element 15 at the other lever end 24. As can be recognized in FIGS. 1A to 1C, the piezoelectric stack 17 is clamped between a base 25 and a counter base 27. In the embodiment shown, the counter base 27 is a separate component to which the lever 22 is joined. In principle, the counter base 27 could, however, also be made in one piece with the lever 22.

The adjustment element 15 can be moved with respect to a valve seat not shown separately by an electrical activation of the piezoelectric stack 17 in order thus to control a fluid metering. An electronic control device, likewise not shown, which is connected to the electrodes 19, 20 is provided for this purpose.

A considerable heat development in the piezoelectric stack 17 in particular arises on an operation of the adjustment apparatus 11 at a high adjustment frequency. To dissipate this heat, a cooling device 30 is provided which comprises a plurality of components.

On the one hand, respective outer thermal conduction layers 33 are applied to the two lateral outer surfaces 31 of the piezoelectric stack 17, as can be seen from FIGS. 1B and 1C. The thermal conduction layers 33 comprise a material having a high thermal conductivity and are each in contact at their flat side remote from the stack 17 with a side wall, not shown, of the housing 13. An effective thermal dissipation from the lateral outer surfaces 31 of the stack 17 to the housing, which is preferably metal, is thus possible.

As a further cooling measure, the piezoelectric stack 17 is divided into two part stacks 17A, 17B arranged next to one another and provided with respective associated electrodes 19, 20. The two part stacks 17A, 17B are not directly adjacent to one another, but are rather separated from one another by an intermediate space 34.

Due to the division, the ratio of surface to volume, and thus the capability of thermal dissipation, is larger for the total stack 17 than would be the case for a non-divided stack. Furthermore, heat sinks are arranged in the intermediate space 34, namely a base cooling rib 37 extending from the base and a lever cooling rib 39 extending from the lever 22. As shown, approximately half of the base cooling rib 37 and the lever cooling rib 39 each project into the intermediate space 34 and therefore largely fill it. Inner thermal conduction layers 45 of a material having a high thermal conductivity are arranged in the remaining space between the base cooling rib 37 and the lever cooling rib 39, on the one hand, and the part stacks 17A, 17B, on the other hand.

The base 25 is also undivided like the counter base 27. A clamping screw 43 serves to clamp the part stacks 17A, 17B together between the base 25 and the counter base 27. To generate a uniform clamping pressure, the clamping screw 43 is arranged centrally with respect to the total stack 17. It extends through the intermediate space 34 in parallel with a stack direction S of the stack 17. It can be recognized in FIG. 1A that the clamping screw 43 has a shaft section 45 with a flattened cross-section extending through the intermediate space 34. A nut 47 is provided to tighten the clamping screw 43.

Figure 2:
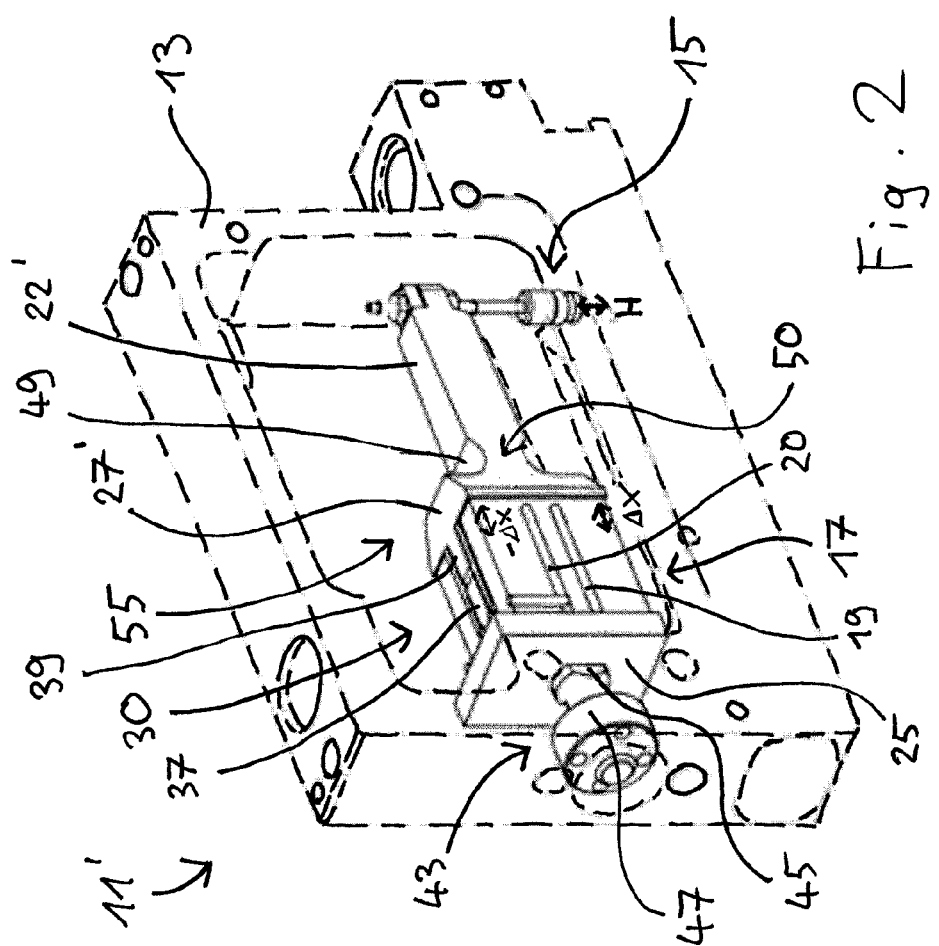
FIG. 2 shows a second embodiment of a piezoelectric adjustment apparatus in accordance with the invention in a perspective view.

The adjustment apparatus 11' shown in FIG. 2 and configured in accordance with a further embodiment of the invention has a similar design to the above-described adjustment apparatus 11, with components which are the same or equivalent being marked with the same reference numerals. A difference from the adjustment apparatus 11 shown in FIGS. 1A-1C comprises the lever 22' not being designed as a stiff component, but rather having a flexible section 49. The flexible section 49 is formed in that the lever 22' has a reduced cross-sectional size in an end region facing the counter base 27'. Since the lever 22' is produced from an elastic material at least in the region of the flexible section 49, the flexible section 49 forms a joint 50 which allows a resilient pivoting of the lever 22' with respect to the stack 17. The counter base 27' is here formed as part of the lever 22' itself. As required, sections of the base 25, of the counter base 27' and/or of the piezoelectric stack 17 could also be configured as spring-elastic.

The oscillatory character of the force transmission arrangement 55 formed by the base 25, by the piezoelectric stack 17, by the counter base 27', by the lever 22' and by the adjustment element 15 effects an overshoot of the adjustment movement with respect to the drive movement in a specific frequency range. This overshoot can be utilized to increase the stroke H of the adjustment element 15 at the associated valve seat with a predefined torsion stroke $\Delta x/-\Delta x$ of the piezoelectric stack 17. The effect of the overshoot is the greatest in the resonant case, that is in an operation of the adjustment apparatus 11' at the resonant frequency of the oscillatory force-transmission arrangement 55. This is illustrated in FIGS. 3A and 3B.

Figure 3A:
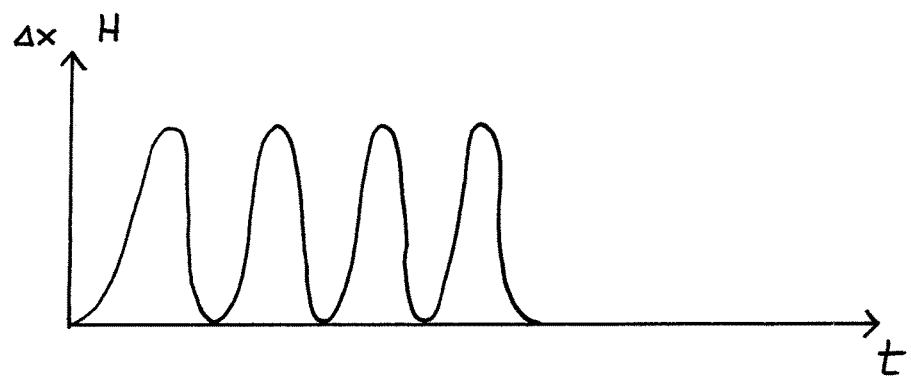
FIGS. 3A and 3B show the temporal progression of the stroke of an adjustment element and of the deflection of a piezoelectric stack of the adjustment apparatus shown in FIG. 2 at different switching frequencies.
Figure 3B:
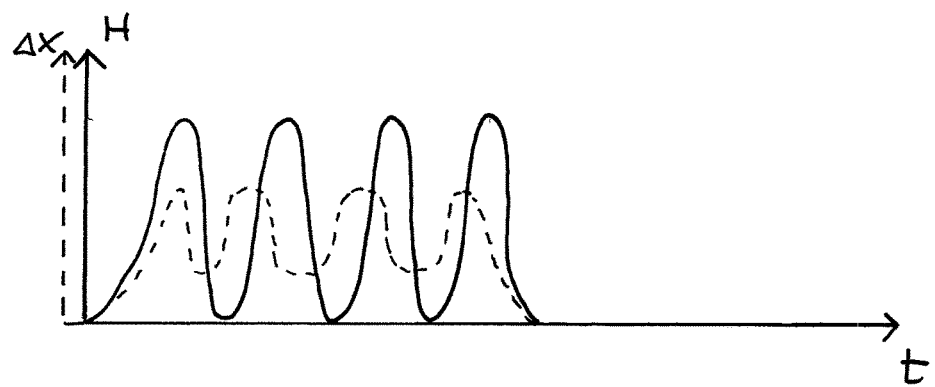

FIG. 3A shows the temporal progression of the stroke H and the $\Delta\Delta x$ in an operation of the adjustment apparatus 11' far remote from the resonant frequency. The stroke H here exactly follows the torsion stroke $\Delta x$ and the amplitudes of the two values are the same—apart from a proportionality factor dependent on the length of the lever 22' which is not considered here. An identical extent of the stroke H with respect to the torsion stroke $\Delta x$ would be produced for an adjustment apparatus without a spring-elastic section of the force-transmission arrangement 55. In contrast, FIG. 3B shows the temporal progression of the stroke H and of the torsion stroke $\Delta x$ on an operation of the adjustment apparatus 11' at the resonant frequency. In this case, the amplitude of the torsion stroke $\Delta x$ is much smaller than the amplitude of the stroke H. In addition, the two progressions are phase shifted by 90° after a brief transient phase which only extends over a single oscillation in FIG. 3B. The fact that a much smaller torsion stroke $\Delta x$ of the piezoelectric stack 17 is present with the same stroke H of the adjustment element 15 means a considerable reduction in the input energy to be supplied to the piezoelectric stack 14 and thus an accordingly smaller heating of the piezoelectric stack 17.

To utilize the effect of the overshoot as much as possible, the resonant frequency of the force-transmission arrangement 55 can be adapted to a predefined nominal frequency of the adjustment element 15. For this purpose, in the example shown, the mass of the lever 22' and the spring constant of the joint 50 are in particular to be adapted.

Overall, the invention allows a considerable power increase of piezoelectrically operated adjustment apparatus and in particular an increase of the switching frequency in comparison with conventional arrangements.

REFERENCE NUMERAL LIST

11, 11' piezoelectric adjustment apparatus
13 housing
15 adjustment element
17 piezoelectric stack
17A, 17B part stack
19 electrode
20 electrode
21 layer of piezoelectric material
22, 22' lever
23 lever end
24 lever end
25 base
27, 27' counter base
30 cooling device
31 lateral outer surface
33 outer thermal conduction layer
34 intermediate space
35 inner thermal conduction layer
37 base cooling rib
39 lever cooling rib
43 clamping screw
45 shaft section
47 nut
49 flexible section
50 joint
55 force-transmission arrangement
S stack direction
H stroke of the adjustment element
$\Delta x/-\Delta x$ torsion stroke of the piezoelectric stack

What is claimed is:

1. A piezoelectric adjustment apparatus,
having a piezoelectric stack which comprises a plurality of layers of piezoelectric material arranged in a stacked manner and each provided with electrodes;
having a lever mechanically connected to the piezoelectric stack for converting a drive movement of the stack into an adjustment movement of an adjustment element provided at the lever, and having a cooling device for dissipating heat from the piezoelectric stack, wherein the piezoelectric stack is divided into at least two part stacks arranged next to one another and provided with respective associated electrodes, said part stacks separated from one another by an intermediate space, wherein the cooling device is arranged at least partly in the intermediate space; and/or wherein fluid present in the intermediate space forms a part of the cooling device, and wherein the cooling device comprises at least one cooling body of a thermally conductive material arranged at least partly in the intermediate space, the adjustment apparatus further comprising at least one of a base cooling rib extending from a base and projecting into the intermediate space and a lever cooling rib extending from the lever and projecting into the intermediate space.

2. The adjustment apparatus in accordance with claim 1, wherein the cooling device comprises a layer of thermally conductive material via which layer at least one outer surface of the piezoelectric stack is in contact with a wall section of a housing of the adjustment apparatus.

3. The adjustment apparatus in accordance with claim 2, wherein the outer surface is a side surface.

4. The adjustment apparatus in accordance with claim 1, wherein the piezoelectric stack is divided into exactly two part stacks arranged next to one another.

5. The adjustment apparatus in accordance with claim 1, wherein the piezoelectric stack is divided into part stacks along a division plane extending in parallel with the stack direction.

6. The adjustment apparatus in accordance with claim 5, wherein the piezoelectric stack is divided into part stacks of identical size.

7. The adjustment apparatus in accordance with claim 1, wherein the cooling device comprises a thermally conductive material with which free spaces are filled which are present in the intermediate space between the surfaces of the part stacks.

8. The adjustment apparatus in accordance with claim 1, wherein the piezoelectric stack is clamped by means of a clamping element between a base common to all part stacks and a counter base common to all part stacks, wherein the clamping element extends through the intermediate space in parallel with the stacking direction.

9. The adjustment apparatus in accordance with claim 8, wherein the clamping element comprises a shaft section with a flattened cross-section provided for arrangement in the intermediate space.

\* \* \* \* \*